United States Patent
Mukai

(10) Patent No.: US 6,806,757 B2
(45) Date of Patent: Oct. 19, 2004

(54) LEVEL SHIFT CIRCUIT

(75) Inventor: Takuo Mukai, Oosaka-fu (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 10/648,365

(22) Filed: Aug. 27, 2003

(65) Prior Publication Data

US 2004/0041615 A1 Mar. 4, 2004

(30) Foreign Application Priority Data

Sep. 2, 2002 (JP) ........................................ 2002-256960

(51) Int. Cl.[7] .............................................. H03L 5/00
(52) U.S. Cl. ........................................ 327/333; 326/81
(58) Field of Search ........................ 327/108–112, 333; 326/62–81

(56) References Cited

U.S. PATENT DOCUMENTS 5,684,410 A * 11/1997 Guo .............................. 326/27

* cited by examiner

Primary Examiner—Kenneth B. Wells
(74) Attorney, Agent, or Firm—Dickstein Shapiro Morin & Oshinsky LLP

(57) ABSTRACT

A level shift circuit which performs level shift on a signal output from a first logic circuit operating on a first voltage to output the level-shifted signal to a second logic circuit operating on a second voltage regardless of whether the first voltage is less or greater than the second voltage, by appropriately controlling first and second switching devices using a control circuit depending on the first and second voltages.

6 Claims, 3 Drawing Sheets

LEVEL SHIFT CIRCUIT

BACKGROUND OF THE INVENTION

Field of the Invention

The present invention relates to a level shift circuit which interfaces between two logic circuit blocks driven by two voltages. More particularly, the present invention relates to a level shift circuit which interfaces between two logic circuit blocks in which a power management controlling such that on & off of a power source is performed for each circuit block such as single chip ICs, e.g., LSIs.

Discussion of the Related Art

Recently, with miniaturization of LSIs (i.e., with increase of integration degree of LSIs), a number of circuits can be contained in a chip. Power management is performed on such LSIs. Namely, the circuit blocks in such LSIs are connected to respective power sources so that power consumption can be reduced and a proper voltage can be applied to each of the circuit blocks. In addition, a power is supplied to only circuits which need a power supply. Therefore, when signals are exchanged between circuit blocks using different power sources, a level shift circuit is used.

FIG. 3 is a schematic view illustrating a conventional level shift circuit.

Referring to FIG. 3, a level shift circuit 100 performs level shift on a logic signal sent from a first logic circuit 101 to which a first voltage Vdd1 is applied from a power source to output the level-shifted signal to a second logic circuit 102 to which a second voltage Vdd2 greater than the first voltage Vdd1 is applied from a power source.

The level shift circuit 100 is constituted of a switching device SWa including a N-channel MOS transistor; a latch circuit 111; a first control circuit 112 which controls the operation of the switching device SWa depending on the first voltage Vdd1; and a latch control circuit 113 which controls the operation of the latch circuit 111 depending on the first voltage Vdd1.

In the level shift circuit 100, a case in which the first voltage Vdd1 is 1.5 V which is greater than a predetermined voltage a, the second voltage is 3.0 V, and the threshold voltage of the switching device SWa is 0.5 V will be explained below.

When a High level signal of 1.5 V is input to an input terminal SIN of the level shift circuit 100, a High level control signal SaB of 1.5 V is input from the first control circuit 112 to a gate of the switching device SWa, and thereby the switching device SWa is turned on.

When the switching device SWa is turned on, a voltage of 1.0 V, i.e., difference between the first voltage Vdd1 (1.5 V) and the threshold voltage (0.5V) of the switching device SWa, is applied to one of input terminals of a NAND circuit 121 of the latch circuit 111. By making the current driving ability of an output circuit (not shown) of an inverter 122 less than that of an output circuit (not shown) of the first logic circuit 101, the voltage of the input terminal of the NAND circuit 121 can be increased so as to be about 1.0 V.

In this case, by setting the threshold voltage of the NAND circuit 121 so as to be not greater than 1.0 V, the output terminal of the NAND circuit 121 achieves a Low level (i.e., 0 V), and thereby a High level signal of 3.0 V is output to an output terminal OUT by an inverter 123. At the same time, a High level signal of 3.0 V is input to the input terminal of the NAND circuit 121 via the inverter 122.

Although the output circuit of the inverter 122 has a little current driving ability, the inverter 122 works to further increase the source voltage of the switching device SWa so as to be greater than 1.0 V. Since the gate voltage of the switching device SWa is 1.5 V, the switching device SWa achieves an OFF state.

When the switching device SWa achieves an OFF state, the source voltage of the switching device is further increased, and finally the source voltage reaches 3.0 V, which is the same as the output voltage of the inverter 122, and thereby the switching device SWa achieves a perfect OFF state. As a result, it is prevented that a current is flown from the second logic circuit 102, which is operated by the second voltage Vdd2 greater than the first voltage Vdd1, to the first logic circuit 101, which is operated by the first voltage Vdd1 smaller than the second voltage Vdd2.

When a Low level signal (i.e., 0 V) is input to the input terminal SIN, a High Level control signal SaB of 1.5 V is input to the gate of the switching device SWa and thereby the switching device SWa achieves an ON state, i.e., a conductive state. Therefore, the Low level signal (i.e., 0 V) input to the input terminal SIN is output to one of the input terminals of the NAND circuits 121 of the latch circuit 111 via the switching device SWa. By making the driving ability of the output circuit of the inverter 122 less than that of the output circuit of the first logic circuit 101, the voltage of the input terminal of the NAND circuit 121 can be decreased so as to be not greater than 1.0 V.

Therefore, the output terminal of the NAND circuit 121 achieves a High level of 3.0 V, and a Low level signal is output to the output terminal OUT by the inverter 123. In this case, a Low level signal is input to the input terminal of the NAND circuit 121, with which the switching device SWa is connected, by the inverter 122. In this state, the switching device SWa achieves a ON state, but a current is not flown to the first logic circuit 101 via the input terminal SIN because the voltages of the source and drain are both 0V.

When the fist voltage Vdd1 is not greater than the predetermined voltage a, a Low level signal SaB is output by the first control circuit 112 and in addition a Low level signal SbB is output by the latch control circuit 113. Thereby, the switching device SWa achieves an OFF state, i.e., a shut-off state. In addition, the output terminal of the NAND circuit 121 achieves a High level (i.e., 3.0 V) and a Low level signal is output to the output terminal OUT by the inverter 123.

However, the level shift circuit as illustrated in FIG. 3 can be used for only a case in which the first voltage Vdd1 applied to the first logic circuit 101 outputting a signal to the input terminal SIN is lower than the second voltage Vdd2 applied to the second logic circuit 102 to which a signal is to be input. Namely, the level shift circuit cannot be used for a case in which the first voltage Vdd1 is greater than the second voltage Vdd2.

Because of these reasons, a need exists for a level shift circuit which can be used for both the cases in which the first voltage Vdd1 is greater or less than the second voltage Vdd2.

SUMMARY OF THE INVENTION

Accordingly, an object of the present invention is to provide a level shift circuit which can be used for both of the case in which the first voltage Vdd1 applied to the first logic circuit, which outputs a signal, is smaller than the second voltage Vdd2 applied to the second logic circuit to which the signal is input; and the case in which the first voltage Vdd1 is greater than the second voltage Vdd2.

To achieve such objects, the present invention contemplates the provision of a level shift circuit, which performs level shift on a signal output from a first logic circuit operating on a first voltage to output the signal to a second logic circuit operated by a second voltage, including:
- a switching circuit which is configured to perform input control of the signal output by the first logic circuit and which includes:
  - a first switching device; and
  - a second switching device, which is connected in series with the first switching device;
- a first control circuit which operates on the first voltage and which is configured to control operation of the first switching device depending on the first voltage;
- a second control circuit which operates on the second voltage and which is configured to control operation of the second switching device depending on the second voltage; and
- a latch circuit which operates on the second voltage thereto and which is configured to perform level shift on amplitude of the signal output from the first logic circuit via the switching circuit so as to be the same as the second voltage and to latch a signal level of the level-shifted signal and output the signal to the second logic circuit, wherein when the first voltage is not greater than a predetermined first voltage, the first control circuit allows the first switching device to turn off, and when the first voltage is greater than the predetermined first voltage, the first control circuit allows the first switching device to turn on, and wherein when the second voltage is not greater than a predetermined second voltage, the second control circuit allows the second switching device to turn off, and when the second voltage is greater than the predetermined second voltage, the second control circuit allows the second switching device to turn on.

Alternatively, the level shift circuit may be a level sift circuit, which performs level shift on a signal output from a first logic circuit operating on a first voltage to output the signal to a second logic circuit operated by a second voltage, including:
- a switching circuit which is configured to perform input control of the signal output by the first logic circuit and which includes:
  - a first switching device; and
  - a second switching device, which is connected in series with the first switching device;
- a first control circuit which operates on the first voltage and which is configured to control operation of the first switching device depending on the first voltage; and
- a latch circuit which operates on the second voltage and which is configured to perform level shift on amplitude of the signal output from the first logic circuit via the switching circuit so as to be the same as the second voltage and to latch a signal level of the level-shifted signal and output the signal to the second logic circuit, wherein when the first voltage is not greater than a predetermined first voltage, the first control circuit allows the first switching device to turn off, and when the first voltage is greater than the predetermined first voltage, the first control circuit allows the first switching device to turn on, and wherein the second switching device includes a MOS transistor, and the second voltage is applied to a gate of the MOS transistor.

In addition, the level shift circuit of the present invention may include a latch control circuit which operates on the second voltage and which is configured to control operation of the latch circuit depending on the first voltage. The latch control circuit outputs a predetermined signal to the latch control circuit when the first voltage is not greater than the predetermined first voltage.

Specifically, when the first voltage is greater than the predetermined first voltage, the latch control circuit performs level shift on the amplitude of the signal output from the first logic circuit via the switching circuit so as to be the same as that of the second voltage.

These and other objects, features and advantages of the present invention will become apparent upon consideration of the following description of the preferred embodiments of the present invention taken in conjunction with the accompanying drawings.

DESCRIPTION OF THE PREFERRED EMBODIMENTS

The present invention will be explained in detail referring to drawings.

Figure 1:
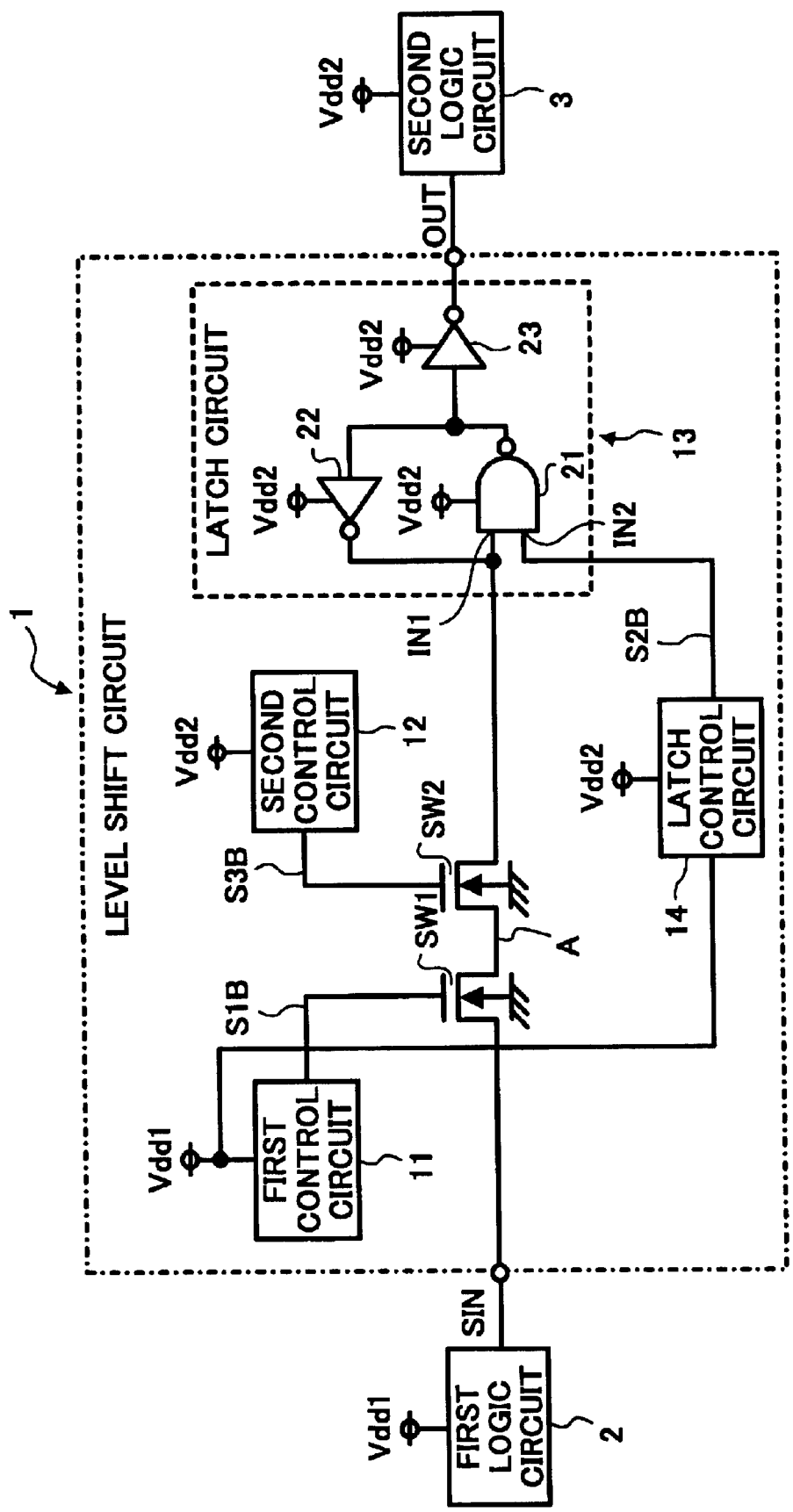
FIG. 1 is a schematic diagram illustrating an embodiment of the level shift circuit of the present invention.

FIG. 1 is a schematic diagram illustrating an embodiment of the level shift circuit of the present invention.

In FIG. 1, a level shift circuit 1 performs level shift on the logic signal input to an input terminal SIN from a first logic circuit 2 to which a first voltage Vdd1, which is predetermined, is applied to output the level-shifted signal to a second logic circuit 3 to which a second voltage Vdd2, which is also predetermined and is different from the first voltage Vdd1 is applied.

The level shift circuit 1 includes:
(1) a first switching device SW1 including a N-channel MOS transistor;
(2) a second switching device SW2 including a N-channel MOS transistor;
(3) a first control circuit 11 configured to control operation of the first switching device SW1 depending on the first voltage Vdd1;
(4) a second control circuit 12 configured to control operation of the second switching device SW2 depending on the second voltage Vdd2;
(5) a latch circuit 13; and
(6) a latch control circuit 14 configured to operation of the latch circuit 13 depending on the first voltage Vdd1.

The first switching device SW1 and the second switching device SW2 constitute a switching circuit.

The first logic circuit 2 and the second logic circuit operates on the first voltage Vdd1. The second logic circuit 3, the second control circuit 12, the latch circuit 13 and the latch control circuit 14 operates on the second voltage Vdd2.

The latch circuit 13 is constituted of a NAND circuit 21, and inverters 22 and 23, all of which operates on the second voltage Vdd2. The first switching device SW1 and the second switching device SW2 are provided in series between the input terminal SIN and an input terminal IN1 of the of the NAND circuit 21. Character A represents a connection part of the first switching device SW1 with the second switching device SW2. Each of the substrate gates of the first switching device SW1 and the second switching device SW2 is grounded.

The first control circuit 11 outputs a Low level control signal S1B to the gate of the first switching device SW1 when the first voltage Vdd1 is not greater than a predetermined voltage α (i.e., a first predetermined voltage α). In contrast, when the first voltage Vdd1 is greater than the predetermined voltage a, the first control circuit 11 outputs a High level control signal S1B to the gate of the first switching device SW1.

The second control circuit 12 outputs a Low level control signal S3B to the gate of the second switching device SW2 when the second voltage Vdd2 is not greater than a predetermined voltage β (i.e., a second predetermined voltage). In contrast, when the second voltage Vdd2 is greater than the predetermined voltage β, the second control circuit 12 outputs a High level control signal S3B to the gate of the second switching device SW2.

The latch circuit 14 generates a control signal S2B depending on the first voltage Vdd1 input, and outputs the control signal S2B to another input terminal IN2 of the NAND circuit 21. The output terminal of the NAND circuit 21 is connected with the IN1 of the NAND circuit 21 via the inverter 22 while being connected with the output terminal OUT via the inverter 23.

The operation of the level shift circuit 1 of the present invention, which has the above-mentioned constitution, will be explained referring to an embodiment in which the first voltage Vdd1 is 1.5 V, the second voltage Vdd2 is 3.0 V, and each of threshold voltages of the switching devices SW1 and SW2 is 0.5 V.

At first, a case in which the first and second voltages Vdd1 and Vdd2 are greater than the predetermined voltages a and β, respectively, and a High level signal of 1.5 V is input to the input terminal SIN from the first logic circuit 2, will be explained.

In such a state, a High level control signal S1B is output from the first control circuit 11 and a High level control signal S3B is output from the second control circuit 12 while the first and second switching devices SW1 and SW2 achieve an ON state. Therefore, the voltage of the connection part A is lower than the gate voltage of the first switching device SW1 by 0.5 V (i.e., the threshold voltage of the switching device SW1). Namely, the voltage of the connection part A is 1.0 V. Since the gate voltage of the second switching device SW2 is 3.0 V, the second switching device SW2 outputs the voltage of the connection part A to the input terminal IN1 of the NAND circuit 21 of the latch circuit 13. By making the current driving ability of an output circuit (not shown) of the inverter 22 less than the current driving ability of an output circuit (not shown) of the first logic circuit 2, The voltage of the input terminal IN1 of the NAND circuit 21 can be increased to about 1.0 V.

In this case, by setting the threshold voltage of the NAND circuit 21 to be not greater than 1.0 V, the output terminal of the NAND circuit 21 comes to have a Low level (i.e., 0 V), and the inverter 23 outputs a High level signal of 3.0 V to the output terminal OUT. In addition, when the NAND circuit 21 comes to have a Low level, the inverter 22 allows the input terminal IN1 of the NAND circuit 21 to have a High level of 3.0 V. Thereby, the second switching device SW2 achieves an ON state while the source and drain are exchanged, resulting in increase of the voltage of the connection part A to 2.5 V. Thereby, the first switching device SW1 achieves an OFF state, resulting in prevention of a current flow to the first logic circuit 2 via the input terminal SIN.

Then, a case in which the first and second voltages Vdd1 and Vdd2 are greater than the predetermined voltages α and β, respectively, and a Low level signal (i.e., 0 V) is input to the input terminal SIN from the first logic circuit 2, will be explained.

In this case, the second switching device SW2 is always in an ON state, i.e., a conduction state. Since a High level control signal S1B of 1.5 V is input to the gate of the first switching device SW1, the first switching device SW1 achieves an ON state, i.e., a conduction state. Therefore, the Low level signal input to the input terminal SIN is output to the input terminal IN1 of the NAND circuit 21 of the latch circuit 13 via the first and second switching devices SW1 and SW2. Since the current driving ability of the output circuit of the inverter 22 is made to be less than the current driving ability of the output circuit of the first logic circuit 2, the voltage of the input terminal IN1 of the NAND circuit 21 can be decreased to be not greater than 1.0 V.

Therefore, the output terminal of the NAND circuit 21 comes to have a High level of 3.0 V, and the inverter 23 outputs a Low level signal to the output terminal OUT. In this case, the inverter 22 inputs a Low level signal to the input terminal IN1 of the NAND circuit 21, with which the first switching device SW1 is connected via the second switching device SW2. In such a state, the switching device SW1 is in an ON state, but each of the voltages of the source and drain thereof is 0V. Therefore, a current is not flown to the first logic circuit 2 via the input terminal SIN.

Next, in a case in which the first voltage Vdd1 is greater than the predetermined voltage α and the second voltage Vdd2 is not greater than the predetermined voltage β, a voltage is not applied to the second logic circuit 3 and therefore the second logic circuit 3 is in a non-operating state. The control signal S3B sent from the second control circuit 12 comes to have a Low level, and thereby the second switching device SW2 is always in an OFF state. Therefore, a current flow from the first logic circuit 2 to the second logic circuit 3 can be prevented.

Next, in a case in which the first voltage Vdd1 is not greater than the predetermined voltage a and the second voltage Vdd2 is greater than the predetermined voltage β, a voltage is not applied to the first logic circuit 2 and therefore the first logic circuit 2 is in a non-operating state. The control signal SiB sent from the first control circuit 11 comes to have a Low level, and thereby the first switching device SW1 is always in an OFF state. Therefore, a current flow from the second logic circuit 3 to the first logic circuit 2 can be prevented.

Then, the operation of the level shift circuit 1 of the present invention will be explained referring to another embodiment in which the first voltage Vdd1 is 3.0 V, the second voltage Vdd2 is 1.5 V, and each of the threshold voltages of the switching devices SW1 and SW2 is 0.5 V. In this case, the values of the predetermined voltages α and β are different from those in the above-mentioned case (for example, the values of α and β are exchanged in this case).

When the first and second voltages Vdd1 and Vdd2 are greater than the predetermined voltages α and β, respectively, and a High level signal of 3.0 V is applied to the input terminal SIN, a High level control signal S1B of 3.0 V is input to the gate of the first switching device SW1, and thereby the first switching device SW1 achieves an ON state. At the same time, a High level control signal S3B of 1.5 V is input to the gate of the second switching device SW2, and thereby the second switching device SW2 also achieves an ON state.

Since the first and second switching devices SW1 and SW2 achieve an ON state, the voltage of the signal input to the input terminal SIN is decreased to be lower than the second voltage Vdd2 (i.e., 1.5 V) by 0.5 V, which is the threshold voltage of the second switching device SW2. Namely, a signal of 1.0 V is input to the input terminal IN1 of the NAND circuit 21. In this case, by making the current driving ability of the output circuit of the inverter 22 less than that of the output circuit of the first logic circuit 2, the voltage of the input terminal IN1 of the NAND circuit 2 can be increased to be about 1.0 V. In addition, by setting the threshold voltage of the NAND circuit 21 to be not greater than 1.0 V, the output terminal of the NAND circuit 21 comes to have a Low level (i.e., 1.0 V), and a High level signal of 1.5 V is output to the output terminal OUT from the inverter 23.

Further, the voltage of the input terminal IN1 of the NAND circuit 21 is increased to 1.5 V by the inverter 22, and therefore the source voltage of the second switching device SW2 becomes the same as the gate voltage of the second switching device SW2. As a result, the second switching device SW2 achieves an OFF state, and thereby a current flow from the first logic circuit 2 (i.e., the high voltage side) to the second logic circuit 3 (i.e., the low voltage side) can be prevented.

Next, a case in which the first and second voltages Vdd1 and Vdd2 are greater than the predetermined voltages $\alpha$ and $\beta$, respectively, and a Low level signal (i.e., 0 V) is applied to the input terminal SIN, will be explained.

In this case, a High level control signal S1B of 3.0 V is input to the gate of the first switching device SW1 and thereby the first switching device SW1 achieves an ON state. At the same time, a High level control signal S3B of 1.5 V is input to the gate of the second switching device SW2 and thereby the second switching device SW2 also achieves an ON state. Since both the first and second switching devices SW1 and SW2 achieve an ON state, the signal input to the input terminal SIN is output to the input terminal IN1 of the NAND circuit 21.

Since the current driving ability of the output circuit of the inverter 22 is less than that of the output circuit of the first logic circuit 2, the voltage of the input terminal IN1 of the NAND circuit 21 can be decreased to be not greater than 1.0 V. Thereby, the output terminal of the NAND circuit 21 comes to have a High level of 1.5 V, and a Low level signal is output to the output terminal OUT by the inverter 23. In this case, a Low level signal is input to the input terminal IN1 of the NAND circuit 21 via the inverter 22.

Although both the switching devices SW1 and SW2 are in an ON state, a current flow from the input terminal SIN is not caused because the voltages of both the ends of the seriated switching devices SW1 and SW2 are 0 V.

Figure 2:
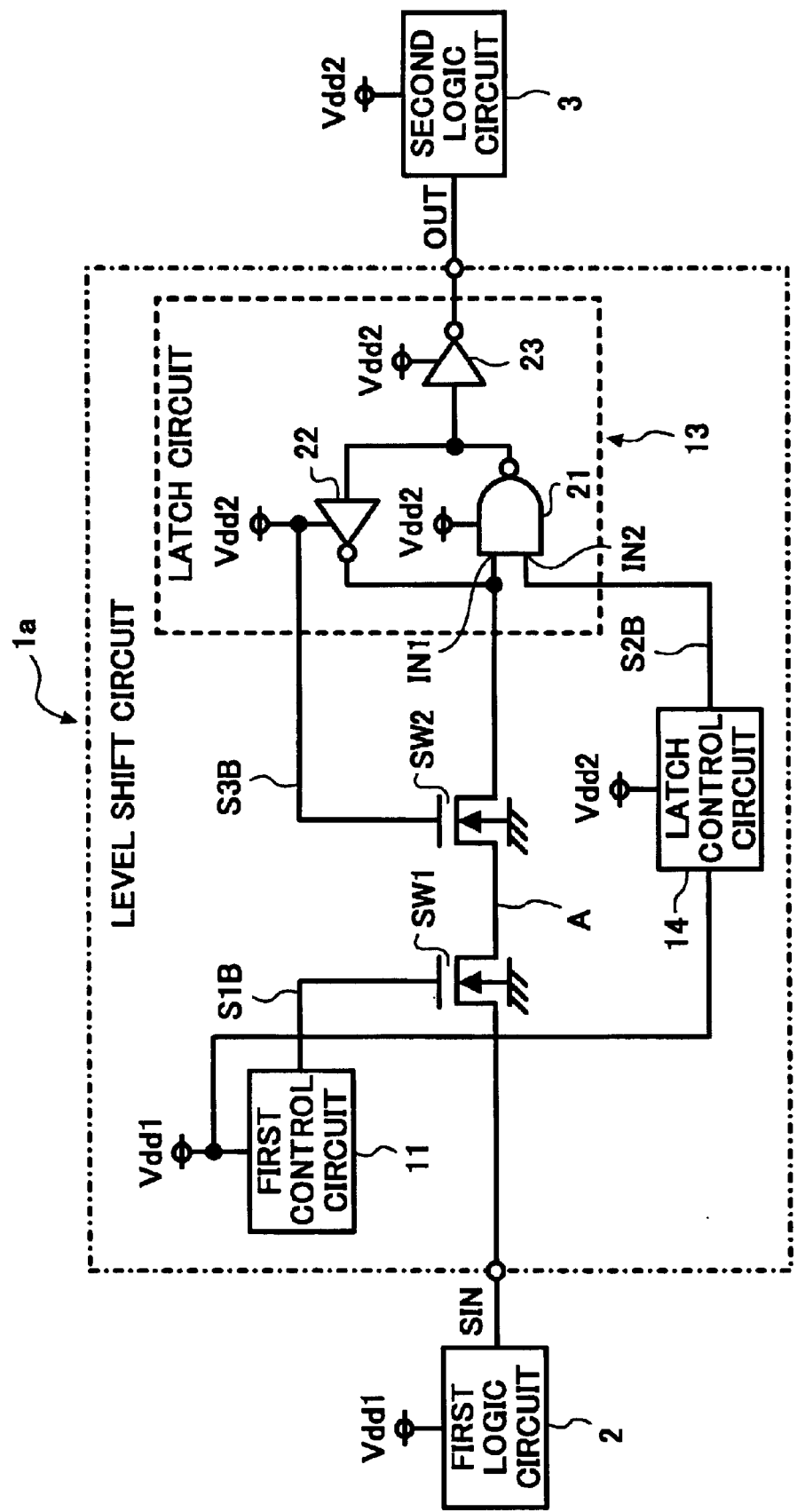
FIG. 2 is a schematic diagram illustrating another embodiment of the level shift circuit of the present invention.
Figure 3:
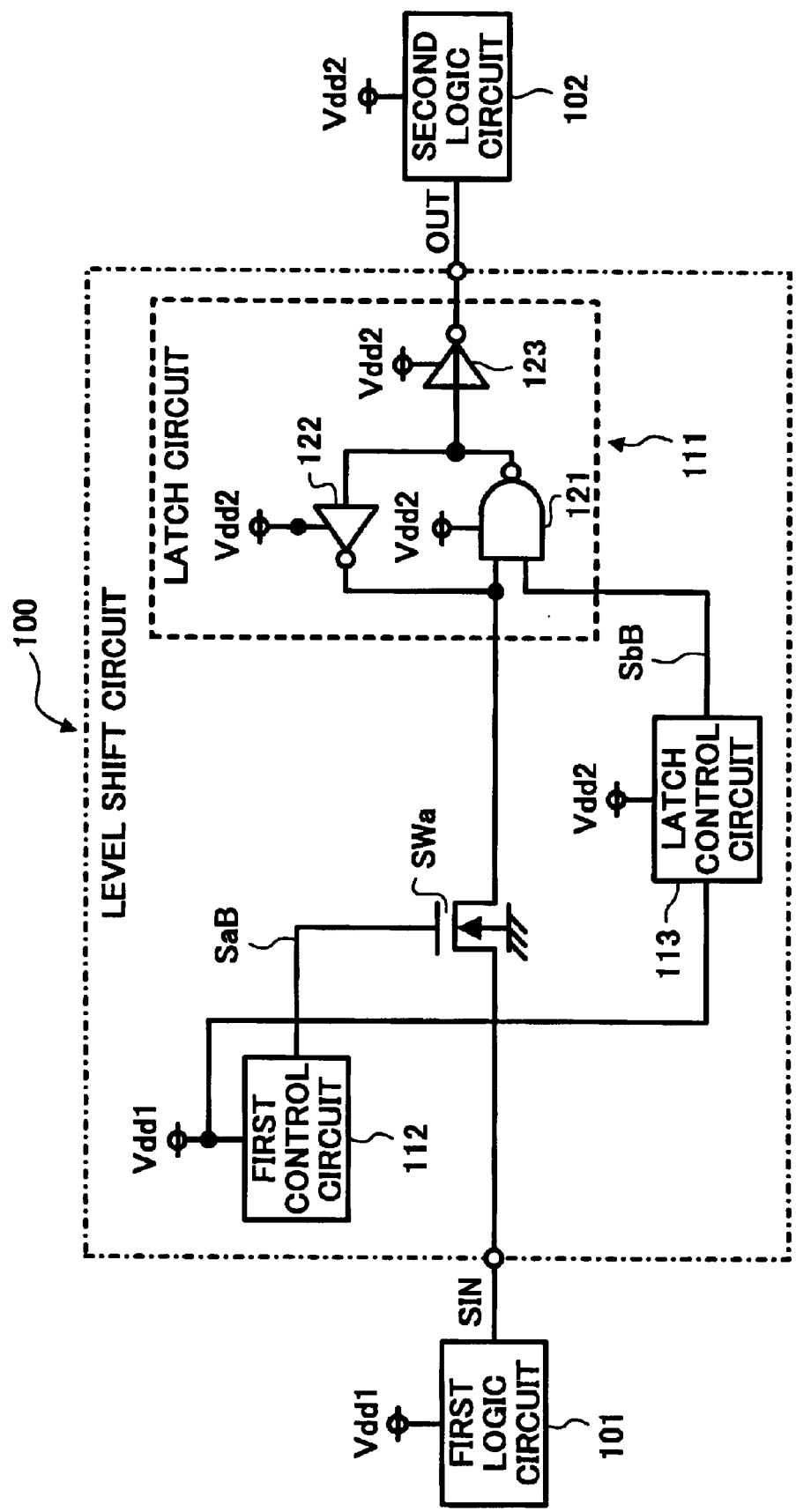
FIG. 3 is a schematic diagram illustrating a background level shift circuit.

Although the second control circuit 12 is used in the embodiment illustrated in FIG. 1, the second voltage Vdd2 can be input to the gate of the second switching device SW2 without using the second control circuit 12, as illustrated in FIG. 2.

In this case, the predetermined voltage $\beta$ is the same as the threshold voltage of the second switching device SW2. When the second voltage Vdd2 is not less than the threshold voltage of the second switching device SW2, the second switching device SW2 achieves an ON state.

The operation of a level shift circuit 1a illustrated in FIG. 2 is the same as that of the level shift circuit 1 if the threshold voltage of the second switching device SW2 is the same as the predetermined voltage $\beta$ set for the second control circuit 12 illustrated in FIG. 1. Therefore the explanation of the operation of the level shift circuit 1a is omitted.

Thus, in the first embodiment of the level shift circuit of the present invention, when the first voltage Vdd1 becomes not greater than the predetermined voltage a, the first control circuit 11 allows the first switching device SW1 to achieve an OFF state. In contrast, when the Vdd1 is greater than the predetermined voltage a, the first control circuit 11 allows the first switching device SW1 to achieve an ON state.

When the second voltage Vdd2 is not greater than the predetermined voltage, the first control circuit 11 allows the second switching device SW2 to achieve an OFF state. When the Vdd2 is greater than the predetermined voltage $\beta$, the first control circuit 11 allows the second switching device SW2 to achieve an ON state. Thus, the signal input to the input terminal SIN is level-shifted in the latch circuit 13 and is output to the output terminal OUT.

Therefore, a precise power management can be performed at a low electric consumption without considering whether or not the voltage of the power source of the first logic circuit, from which the signal is input, is larger than that of the second logic circuit, to which the signal is output.

Effects of the Present Invention

As can be understood from the above description, according to the level shift circuit of the present invention, a second switching device, which performs an ON/OFF operation depending on the second voltage, is provided while being connected with a first switching device in series, and therefore a precise power management can be performed at a low electric consumption without considering whether or not the voltage of the power source of the first logic circuit, from which the signal is input is larger than that of the second logic circuit, to which the signal is output.

Additional modifications and variations of the present invention are possible in light of the above teachings. It is therefore to be understood that within the scope of the appended claims the invention may be practiced other than as specifically described herein.

This document claims priority and contains subject matter related to Japanese Patent Application No. 2002-256960, filed on Sep. 02, 2002, the entire contents of which are herein incorporated by reference.

What is claimed is:

1. A level shift circuit, which performs level shift on a signal output from a first logic circuit operating on a first voltage to output the signal to a second logic circuit operating on a second voltage, comprising:

a switching circuit which is configured to perform input control of the signal output from the first logic circuit and which comprises:
a first switching device; and
a second switching device, which is connected in series with the first switching device;

a first control circuit which operates on the first voltage and which is configured to control operation of the first switching device depending on the first voltage;

a second control circuit which operates on the second voltage and which is configured to control operation of the second switching device depending on the second voltage; and a latch circuit which operates on the second voltage and which is configured to perform level shift on amplitude of the signal output from the first logic circuit via the switching circuit so as to be the same as the second voltage and to latch a signal level of the level-shifted signal and output the signal to the second logic circuit, wherein when the first voltage is not greater than a predetermined first voltage, the first control circuit allows the first switching device to turn off, and when the first voltage is greater than the predetermined first voltage, the first control circuit allows the first switching device to turn on, and wherein when the second voltage is not greater than a predetermined second voltage, the second control circuit allows the second switching device to turn off, and when the second voltage is greater than the predetermined second voltage, the second control circuit allows the second switching device to turn on.

2. A level sift circuit, which performs level shift on a signal output from a first logic circuit operating on a first voltage to output the signal to a second logic circuit operating on a second voltage, comprising:

a switching circuit which is configured to perform input control of the signal output from the first logic circuit and which comprises:
a first switching device; and
a second switching device, which is connected in series with the first switching device;

a first control circuit which operates on applying the first voltage thereto and which is configured to control operation of the first switching device depending on the first voltage; and a latch circuit which operates on the second voltage and which is configured to perform level shift on amplitude of the signal output from the first logic circuit via the switching circuit so as to be the same as the second voltage and to latch a signal level of the level-shifted signal and output the signal to the second logic circuit, wherein when the first voltage is not greater than a predetermined first voltage, the first control circuit allows the first switching device to turn off, and when the first voltage is greater than the predetermined first voltage, the first control circuit allows the first switching device to turn on, and wherein the second switching device comprises a MOS transistor, and the second voltage is applied to a gate of the MOS transistor.

3. The level shift circuit according to claim 1, further comprising:

a latch control circuit which operates on the second voltage and which is configured to control operation of the latch circuit depending on the first voltage, wherein the latch control circuit outputs a predetermined signal to the latch control circuit when the first voltage is not greater than the predetermined first voltage.

4. The level shift circuit according to claim 2, further comprising:

a latch control circuit which operates on the second voltage and which is configured to control operation of the latch circuit depending on the first voltage, wherein the latch control circuit output a predetermined signal to the latch control circuit when the first voltage is not greater than the predetermined first voltage.

5. The level shift circuit according to claim 1, wherein when the first voltage is greater than the predetermined first voltage, the latch control circuit performs level shift on the amplitude of the signal output from the first logic circuit via the switching circuit so as to be the same as the second voltage.

6. The level shift circuit according to claim 2, wherein when the first voltage is greater than the predetermined first voltage, the latch control circuit performs level shift on the amplitude of the signal output from the first logic circuit via the switching circuit so as to be the same as the second voltage.

* * * * *